(12) United States Patent
Lee

(10) Patent No.: US 7,511,524 B1
(45) Date of Patent: Mar. 31, 2009

(54) CONTACT TIP STRUCTURE OF A CONNECTING ELEMENT

(75) Inventor: Oug-Ki Lee, Seoul (KR)

(73) Assignee: PHICOM Corporation, Seoul (KR)

( * ) Notice: Subject to any disclaimer, the term of this patent is extended or adjusted under 35 U.S.C. 154(b) by 0 days.

(21) Appl. No.: 12/103,934

(22) Filed: Apr. 16, 2008

(30) Foreign Application Priority Data

| Dec. 28, 2007 | (KR) | .................. 10-2007-0140419 |
| Dec. 28, 2007 | (KR) | .................. 10-2007-0140420 |
| Dec. 28, 2007 | (KR) | .................. 10-2007-0140421 |
| Dec. 28, 2007 | (KR) | .................. 10-2007-0140422 |

(51) Int. Cl.
*G01R 31/02* (2006.01)

(52) U.S. Cl. .................................................. 324/762
(58) Field of Classification Search ........................ None
See application file for complete search history.

(56) References Cited

U.S. PATENT DOCUMENTS

| 5,914,613 | A | 6/1999 | Gleason et al. |
| 6,091,248 | A * | 7/2000 | Hellemans et al. .......... 324/719 |
| 6,520,778 | B1 * | 2/2003 | Eldridge et al. ............. 324/762 |
| 6,672,875 | B1 * | 1/2004 | Mathieu et al. ............... 439/66 |
| 6,825,422 | B2 | 11/2004 | Eldridge et al. |
| 7,073,254 | B2 * | 7/2006 | Eldridge et al. ............... 29/843 |
| 2006/0237856 | A1 * | 10/2006 | Eldridge et al. ............. 257/784 |
| 2007/0216433 | A1 * | 9/2007 | Miura et al. ................. 324/762 |
| 2008/0098804 | A1 * | 5/2008 | Abramovitch ............... 73/105 |
| 2008/0157799 | A1 * | 7/2008 | Gritters et al. .............. 324/762 |

FOREIGN PATENT DOCUMENTS

| KR | 10-2005-12849 | 2/2005 |
| WO | 2005/085877 | 9/2005 |

* cited by examiner

*Primary Examiner*—Jermele M Hollington
(74) *Attorney, Agent, or Firm*—Lexyoume IP Group, LLC; Jongwon Kim

(57) ABSTRACT

The present invention relates to a contact tip structure of a connecting element designed for electric testing of electronic components. The connecting element comprises a fixing post coupled to a first electronic component; a beam extending away from said fixing post; a base coupled at one end of the said beam; and a contact tip extending vertically from the bottom surface of the said base. The beam includes an elastic region and an inelastic region extending at a shorter distance than the elastic region. The base vertically extends from the inelastic region in a certain distance and the horizontally extended length (L) of the elastic region of the beam and the vertically extended length (D) of the base are determined such that the contact tip is horizontally extended at a pre-determined distance according to the following formula:

$D\sin\theta + L(\cos\theta - 1)$ ($\theta$ means an angle of elastic deformation of the beam).

36 Claims, 8 Drawing Sheets

CONTACT TIP STRUCTURE OF A CONNECTING ELEMENT

TECHNICAL FIELD

The present invention relates to a contact tip structure of a connecting element designed for the electric test of an electronic component, particularly to a contact tip structure making a homogenous scrub as pre-determined on the surface of an electrode pad.

BACKGROUND ART

The micro tip structure for electronic components testing is disclosed in prior arts. Semiconductors or microprocessors manufactured in large volume on a silicon wafer should be subject to a fault inspection prior to the individual semiconductor wafer being divided into each element. In order to detect an electric defect of an element, a probe tip associated with a testing device comes into contact with each element and sends input signals to them. The testing device then detects a fault on each element based on response signals from each element. The micro elements are densely fabricated in large volume, thus the probe for testing needs to have sufficiently high density.

Electronic components are mass manufactured in small size. A plurality of electrode pads associated with a plurality of electronic components is arranged in a regular form and every probe should contact with corresponding electrode pads. The whole size of probe may be hundreds of μm and the size of both contact tip and electrode pad may be tens of μm. During the testing of electronic components, hundreds or thousands of connecting elements or contact tips are simultaneously brought into contact with the same number of electrode pads, make scrubs on each of the surface of an electrode pad by a pre-determined pressure, send signals and separate from the electrode pad. This process is repeated during the entire process.

The connecting element and the contact tip should have a structure required for making a scrub on the electrode pad at a pre-determined position in a regular form and maintaining its form during the repeated contact process, and simultaneously, the location of the contact tip for making a scrub on the electrode pad should be determined.

The structures of connecting elements in various forms have been disclosed in prior arts. KR Pat. No. 267,836 entitled "A hollowness typed probe tip and a method for producing it" discloses a plurality of tips forming a part of a sphere for separation and contact between a probe cards. WO 2005/085877 discloses a contact tip with a plurality of protrusions. U.S. Pat. No. 6,672,875 discloses a probe with a thin plate beam and a pyramid structure contact tip and U.S. Pat. No. 6,825,422 discloses a contact tip with a blade. The technologies disclosed in prior arts relate to the process of a contact tip contacting with and separating from electrode pads, but they don't specify a structure of contact tip or a form of scrub. They don't disclose where to dispose the contact tip on electrode tips in order to make a scrub at a pre-determined position. The structure of the connecting element should be determined depending on the form of a scrub on the electrode pad. Further, the contact tip needs to be arranged in a regular position on the electrode pad such that the contact tip causes a scrubbing in a regular form. The present invention relates to a contact tip structure of a connecting element which makes a pre-determined form of scrub and a method of arranging the contact tip which makes a scrub at a pre-determined position.

It is an object of the present invention to provide a contact tip with a structure making a scrub on an electrode pad in a regular form.

It is other object of the present invention to provide a contact tip with a structure compensating vertical height errors between connecting elements.

It is another object of the present invention to provide a method of disposing a contact tip in order that the contact tip makes a scrub at a pre-determined position.

Figure 2:
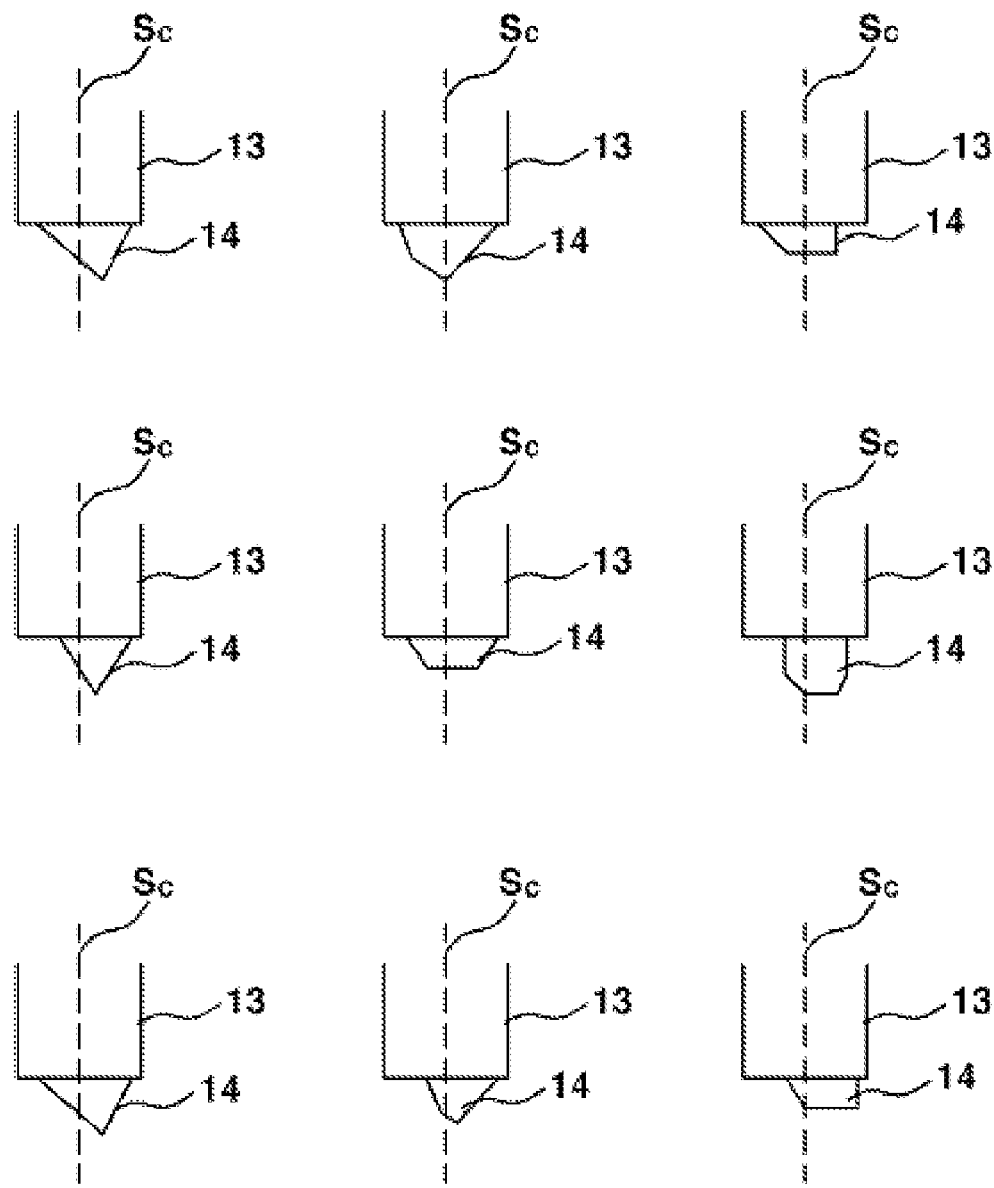

The FIG. 2 shows an embodiment of the contact tip in various forms having asymmetric structure.

Figure 3A:
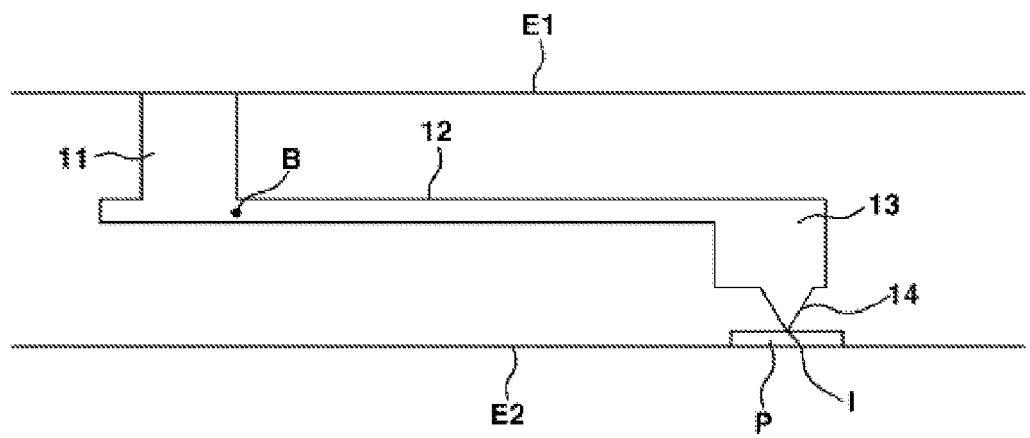
Figure 3B:
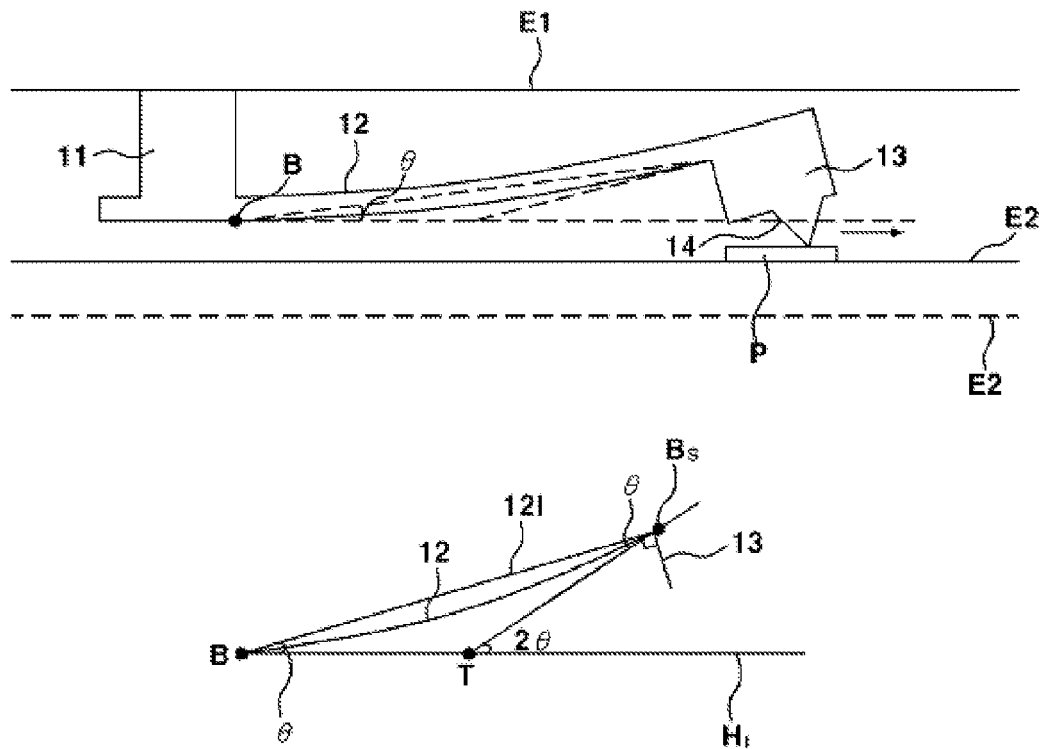
Figure 3C:
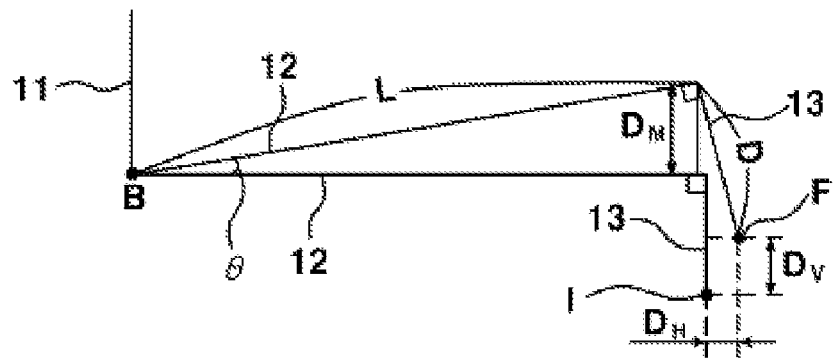

FIGS. 3a to 3c show a process wherein the contact tip contacts with the electrode pad and makes a scrub.

Figure 4A:
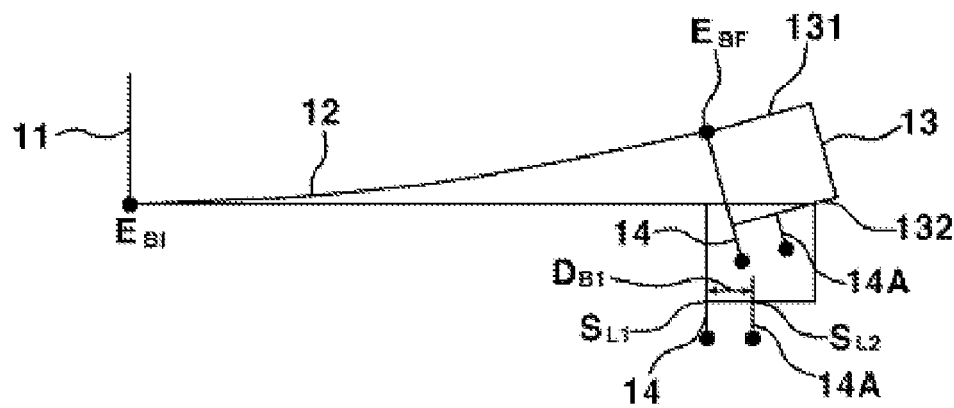

FIG. 4a shows the contact tip when it changes its position by the relationship of the contact tip coupled with the base.

Figure 4B:
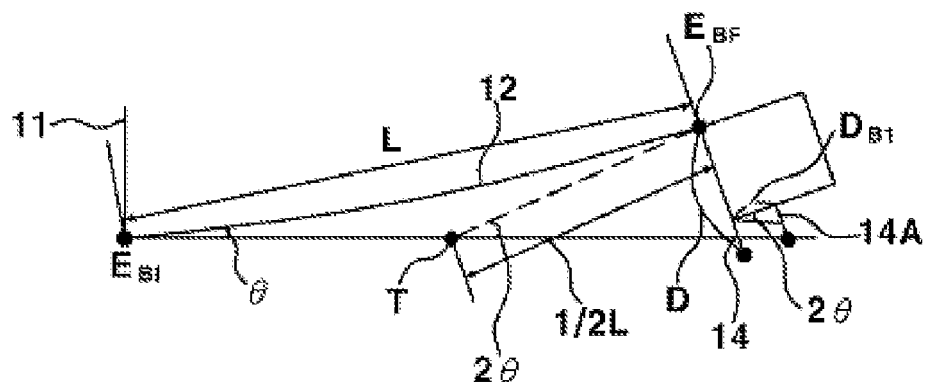

FIG. 4b shows the contact tip when it changes its position with the complemented method.

Figure 4C:
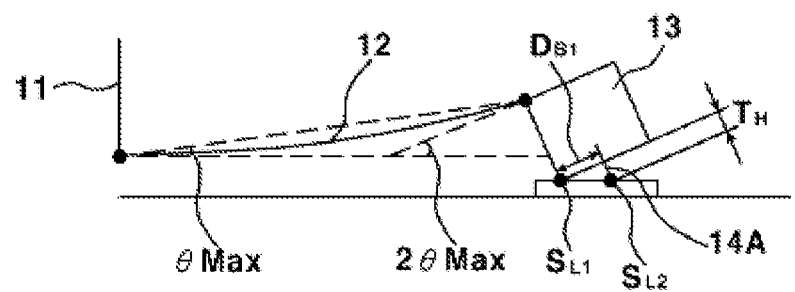

FIG. 4c shows the relationship of the extended distance of the base and the height of the contact tip.

Figure 5A:
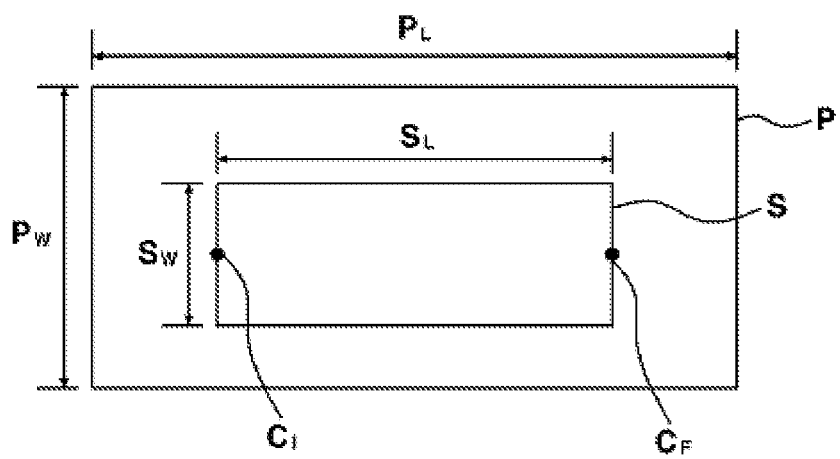

FIG. 5a shows an embodiment of the scrub on the electrode pad made by the contact tip.

Figure 5B:
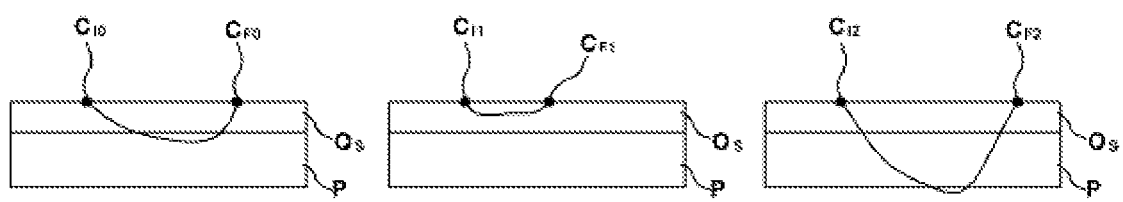

FIG. 5b shows various forms of scrubs made by connecting elements having a different height.

Figure 5C:
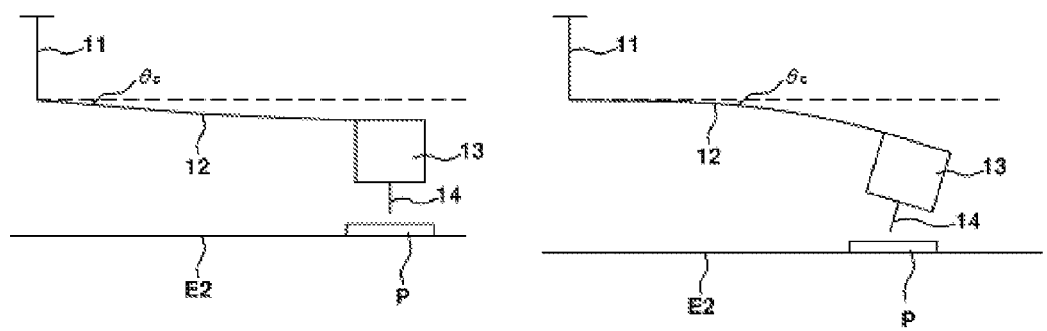

FIG. 5c shows an embodiment of the beam extending with an inclination angle.

Figure 5D:
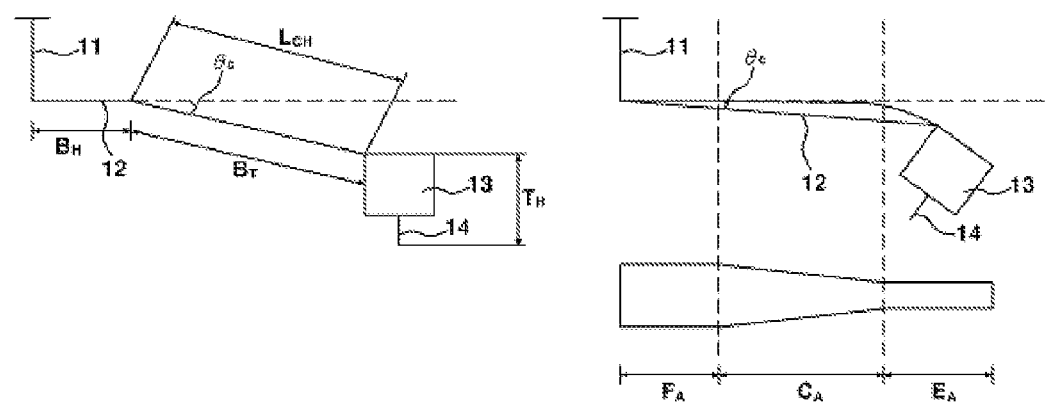

FIG. 5d shows other embodiment of the beam extending with an inclination angle.

Figure 6A:
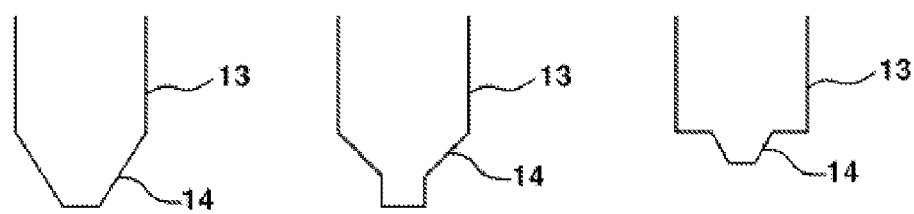

FIG. 6a shows various forms of contact tip structure.

Figure 6B:
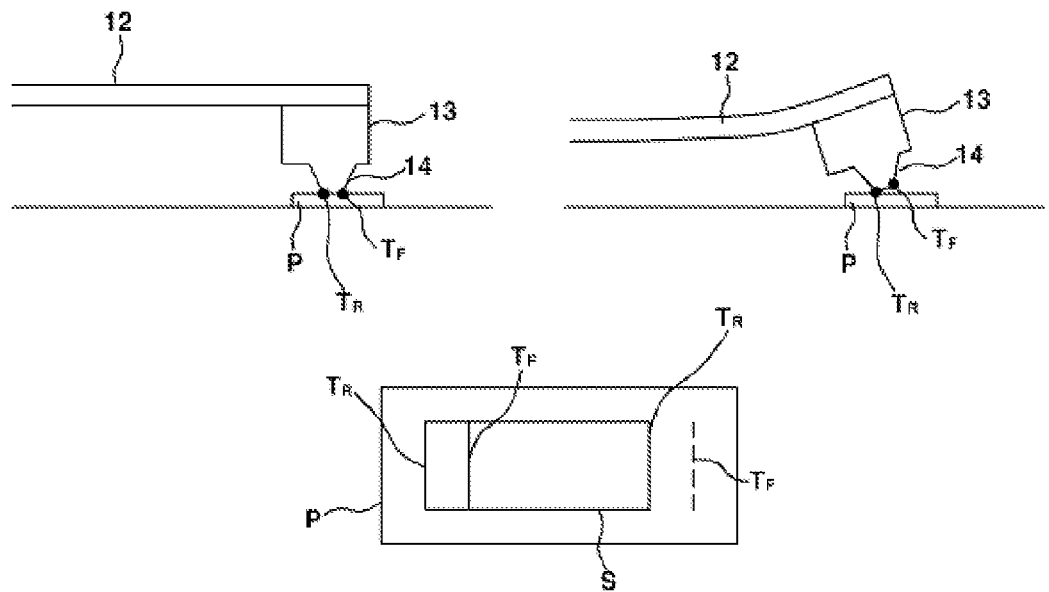

FIG. 6b shows a process of making a scrub by moving the contact tip horizontally on the electrode pad.

Figure 6C:
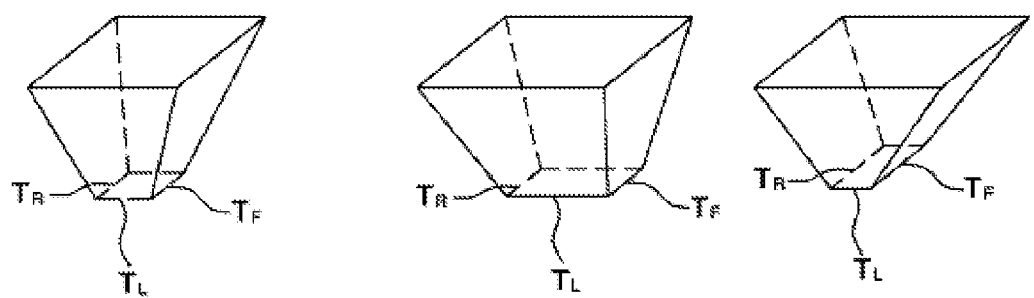

FIG. 6c shows various forms of contact tip structure.

Figure 7:
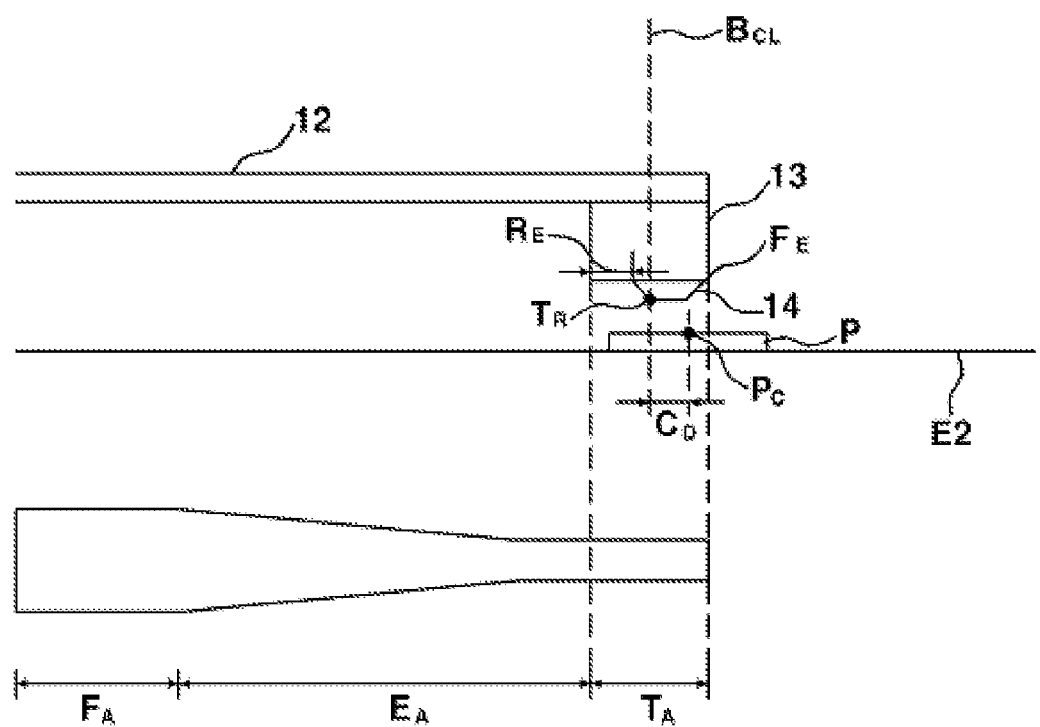
Figure 7:
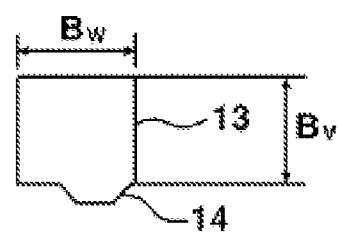

FIG. 7 shows an embodiment of the contact tip and an embodiment of its relative position to the electrode pad.

DISCLOSURE OF THE INVENTION

According to a preferred embodiment of the present invention, a connecting element comprises a fixing post coupled to a first electronic component; a beam extending away from said fixing post; a base coupled at one end of the said beam; and a contact tip extending vertically from the bottom surface of the said base. The beam includes an elastic region and an inelastic region extending at a shorter distance than the elastic region. The base vertically extends from the inelastic region in a certain distance, the contact tip is coupled to the bottom surface of the base having a free end and the horizontally extended length (L) of the elastic region of the beam and the vertically extended length (D) of the base are determined such that the contact tip is horizontally extended at a pre-determined distance, wherein the height of the contact tip is limited by the length of the free end and the horizontal movement distance of the contact tip is determined according to the following formula:

$$D\sin\theta + L(\cos\theta - 1) \text{ ($\theta$ means an angle of elastic deformation in the elastic region).}$$

According to other preferred embodiment of the present invention, the contact tip structure of a connecting element comprising a fixing post coupled to a first electronic component; a beam extending away from said fixing post; a base coupled at one end of the said beam; and a contact tip extending vertically from the bottom surface of the said base, is characterized in that the beam includes an elastic region and an inelastic region extending at a shorter distance than the elastic region, the base vertically extends from the inelastic region in a certain distance, the contact tip is coupled to the bottom surface of the base having a free end and the horizontally extended length (L) of the elastic region of the beam and the vertically extended length (D) of the base are made in order that a vertically movement distance of the contact tip has predetermined values. Wherein the height of the contact tip is limited by the length of the free end and the vertically movement distance of the contact tip is determined according to the following formula:

D(1−cos θ)+Lsin θ (θ means an angle of elastic deformation in the elastic region).

According to other preferred embodiment of the present invention, a connecting element comprising a fixing post coupled to a first electronic component; a beam extending away from said fixing post; a base coupled at one end of the said beam; and a contact tip coupled at the bottom surface of the said base, is characterized in that the beam and the base have an elastic and inelastic structure, respectively and the contact tip is coupled to the bottom surface of the base having a free end. Wherein the horizontally extended distance (L) of the beam and the vertically extended distance (D) of the base are determined by the following formulas represented movement distance of the contact tip, and the base has an asymmetric structure to the contact tip:

The horizontally movement distance of the contact tip:

Dsin θ+L(cos θ−1)

The vertically movement distance of the contact tip:

D(1−cos θ)+Lsin θ (θ means an angle of elastic deformation in the elastic region)

According to other preferred embodiment of the present invention, L and D are determined in order that the horizontally extended distance is decreased.

According to other preferred embodiment of the present invention, L and D are determined in order that the vertically extended distance is increased.

According to other preferred embodiment of the present invention, a method of disposing the contact tip attached a certain bottom surface of a base that is coupled a first electronic component and a beam extended in direction of an electrode pad formed a second electronic component in order to make a pre-determined form of scrub on the electrode pad is characterized in that the basis line for arranging the contact tip is moved at a certain distance from the center of the electrode pad towards the beam direction. Wherein the certain distance is determined by the following formula represented the horizontal movement distance of the contact tip:

Dsin θ+L(cos θ−1)(θ means an angle of elastic deformation of the beam)

Hereinafter, the present invention will be described in detail with reference to drawings and examples. These examples are provided only for the illustrative purpose, and it should not be construed that the scope of the invention is limited thereto.

Figure 1:
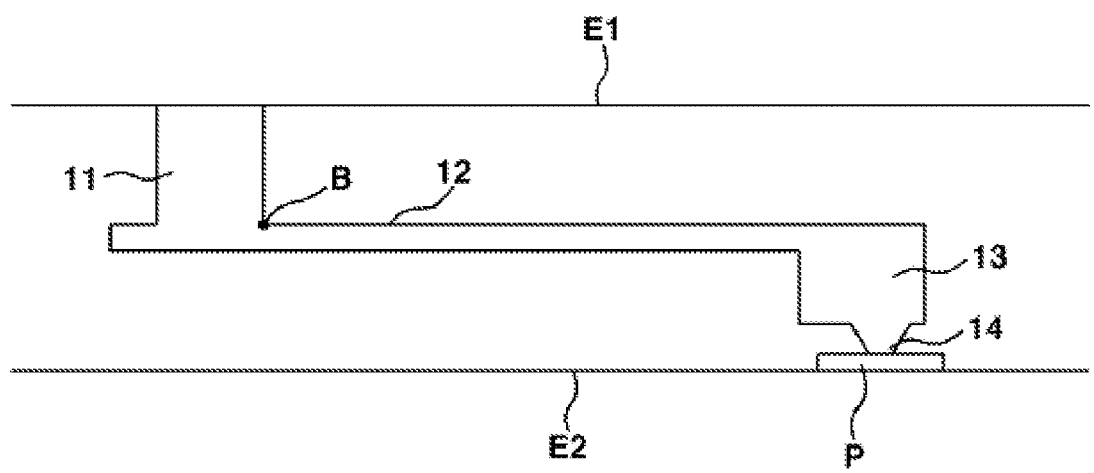
FIG. 1 shows an embodiment of a connecting element with a contact tip.

FIG. 1 shows an embodiment of a connecting element with a contact tip according to the present invention.

The connecting element comprises a fixing post 11 coupled to the surface of a first electronic component E1; a beam 12 extending along the plane of the first electronic component towards an electrode pad P formed on the surface of a second electronic component E2; a base 13 extending vertically from one portion of the beam 12 towards the electrode pad P; and a contact tip 14 contacting with the electrode pad P.

The fixing post 11 is made of inelastic conducive materials and firmly coupled at a pre-determined position of the first electronic component E1. The first electronic component E1 forms e.g. an electric path like a space transformer in order to send a signal to other electronic components. The beam which extends away from the fixing post 11 is at least partially made of elastic materials capable of elastic deformation and has a basis point B at a particular position. The base 13 may be made of the same conducive material as the beam 12 or different conducive materials, and its volume is relatively larger than the contact tip 14. The base 13 may be included in the inelastic extended region. The contact tip 14 is formed on the bottom surface of the base 13. The contact tip 14 makes contact with the electrode pad P formed at a pre-determined position of the second electronic component E2 to make a scrub. The second electronic element E2 may be e.g. a semiconductor die and may contact with the contact tip 14 to transfer electric signals. The basis point of elastic deformation B formed at a particular position of the beam 12 is movable depending on the width, thickness, length and the modulus of elasticity of the beam 12 and the relative difference of thickness between the fixing post 11 and the beam 12. The basis point of elastic deformation B forms a boundary of elastic and inelastic regions. In fact, the basis point of elastic deformation B is not determined as a particular point, line or plane. In the embodiment of the FIG. 1, the basis point of elastic deformation B form is at the boundary of elastic and inelastic region in real practice. When the contact tip 14 moves up, the fixing post (11) doesn't move up and down. Each part of the beam 12 in the elastic region, however, is deflected upward and in this case, the basis point of elastic deformation B is positioned at the boundary of the fixing post 11 and the beam 12, meaning that the basis point of elastic deformation B is relatively determined. For example, if a part of the beam 12 coupled with the fixing post 11 is designed to have greater width and thickness, and the rest of the beam 12 with relatively smaller width and thickness, the basis point of elastic deformation B may be positioned relatively closer to the base 12. The base 13 may change its position if the contact tip 14 is affected by a force, but as it doesn't deflect vertically to the length, it is included in the inelastic region. The beam 12 may extend along the surface of the first electronic components E1 horizontally or inclinationaly toward the electrode pad.

According to the present invention, the contact tip 14 may have an asymmetric structure, which includes shape and position asymmetry. The contact tip 14 having an asymmetric structure is described as below.

In this description, the beam 12 extends from the fixing post 11 and the base 13 is coupled to at one end of the beam 12. Since a part of the beam is coupled to the base 13, the beam 12 and the base 13 meet on a horizontal plane in real practice. The elastic deformation region of the beam 12 is where the beam is not coupled with the base 13, and the inelastic region is where it is coupled with the fixing post 11 and the base 13. According to the present invention, the beam 12 includes the inelastic region, but only the elastic region is described as the beam 12 in this description in order that the invention may be more clearly understood. In real practice, however, one portion of the beam 12 is coupled to the fixing post 11 and a portion of the opposite side of the beam 12 is coupled to the base 13, and the beam 12 includes both the elastic and inelastic regions.

The FIG. 2 shows an embodiment of the contact tip in various asymmetric structures according to the present invention.

The connecting element in the present invention has asymmetric structures in terms of shape and position. The shape asymmetry means that the contact tip 14 has a geometrically asymmetric structure as shown in FIG. 2 (up), meaning that it could be divided into matching halves by drawing a line down the center $S_c$. A position asymmetry means that it may be geometrically symmetric if the contact tip 14 of the base 13 moves as shown in FIG. 2 (middle). The contact tip 14 may have both shape and position asymmetry structures as shown in FIG. 2 (down). In case of preparing a sacrificial substrate such as a silicon substrate, most of the contact tips 14 are shaped symmetrically. Thus, the structure of shape asymmetry may not be applied to the mass production of the contact tip 14. Meanwhile, the asymmetrical structure may be easily applied to the mass production of the contact tip 14 or the connecting element. The asymmetric structure referred to in this description almost always includes both shape and position asymmetric structures except for a special case.

The contact tip 14 comes into contact with the electrode pad P and makes a scrub. The shape of scrub made by the contact tip 14 contacted with the electrode pad P may be determined by elastic deformation of the beam 12 and the structure of the contact tip 14.

FIGS. 3a to 3c shows a process wherein the contact tip contacts with the electrode pad and makes a scrub according to the present invention.

Referring to FIG. 3a, the contact tip 14 of the connecting element comes into contact with the electrode pad P formed on the surface of the second electrode component E2. A plurality of the electrode pad P are arranged at a pre-determined location of the second electrode component E2 and the connecting element is disposed on the surface of the first electronic component E1 corresponding to each electrode pad P. In order to make the contact tip 14 contact with the electrode pad P, the second electronic component E2 is approached to the first electronic component E1. The contact tip 14 may be a pyramid-shaped with sharp end or a prismoid-shaped with flat end. The end of contact tip 14 comes into contact with an initial contact point I of the electrode pad P and as the second electronic substrate E2 moves up, a certain pressure or force is exerted to the electrode pad P. As the contact tip 14 forces down the electrode pad P, the contact tip is also pressured in the reaction force. Due to this pressure to the contact tip 14, the beam 12 elastically deforms in the upper direction, and simultaneously the contact tip 14 slides the electrode pad P to make a scrub on it. The electrode pad P, typically, has a native oxidation layer at a thickness between 200 to 1000 Angstroms. Therefore, a certain amount of pressure should be exerted in order to remove the oxidation layer, such that the electric signals may be transferred to the electrode pad P. In order to make a scrub required for removing the oxidation layer, the connecting element has a structure wherein the contact tip 14 moves along the surface of the electrode pad P. In case of the connecting element presented as an embodiment in FIG. 3a, it is firmly coupled to the first electronic component E1 by the fixing post 11 and the beam 12 elastically deforms up and down. As a result, the contact tip 14 horizontally moves a certain distance by the pressure from the electrode pad P. The vertically extended length of the fixing post 11 may be limited by the range of elastic deformation of the beam 12 in the up and down direction. The fixing post 11 may be formed with any conductive materials, preferably inelastic materials. The beam 12 may be prepared as a monolithic component integrated with the fixing post 11 or prepared separately and then coupled to the fixing post 11. The beam portion coupled to the fixing post 11 may be inelastic and the beam portion coupled to the base 13 may also be inelastic. In real practice, the beam 12 is prepared as a monolithic component, which makes it difficult to make out of other metallic materials. Therefore, it is preferred that the whole part of the beam 12 is made of elastic materials and the modulus of elasticity may be controlled by changing the thickness and the width in the extended direction.

Even in the case of preparing the whole part of the beam 12 out of elastic materials, it does not cause elastic deformation in a region where the beam 12 is coupled with the fixing post 11. Thus, the elastic deformation of the beam 12 may occur mainly at the boundary of the fixing post 11 and the beam 12 may be the basis point of elastic deformation B. If the beam 11 elastically deforms up and down, it deforms along the curve line and, as a result, the basis point of elastic deformation B may not be located as pre-determined. For example, the basis point of elastic deformation B may be a line, a plane or have a volume.

The base 13 vertically extends towards the electrode pad P and may be prepared as a monolithic component integrated with the beam 12 or prepared separately and then coupled to the beam 12. The base 13 is made of the same material as the beam 12 or different materials. Preferably, the base 13 may be made of a material with a higher modulus of elasticity compared to the beam 12. The base 13 increases the pressure to the contact tip 14 and thereby it may be easy to make a scrub on the electrode pad P. The contact tip 14 is formed on the bottom surface of the base 13. The contact tip 14 may be prepared as a monolithic component integrated with the base 13 or prepared separately and then coupled to the beam 13. The contact tip 14 may have a symmetric or asymmetric structure as mentioned above. The shape of the contact tip 14 may be pyramid, cone, prismoid or a truncated cone, and it may initially contacts with the electrode pad P as a point, a line or a plane.

FIG. 3b shows the beam 12 when it elastically deforms by the movement of the second electronic component E2.

If the second electronic component E2 contacts with the contact tip 14 and moves from the initial location (expressed as a dotted line) toward the first electrode component E1, the contact tip 14 moves upward and, at the same time, moves horizontally in the extended direction (expressed by an arrow). Here, the contact tip 14 remains non-separated from the surface of the electrode pad P. When the second electronic element E2 moves to a pre-determined position of the first electronic element E1, the contact tip 14 reaches the final contact point and makes a scrub designed for sending an electric signal to the electrode pad P. Further, the connecting element sends an electric signal to the second electronic component E2 through the electrode pad P such that a fault of electronic components may be detected.

If the beam 12 elastically deforms as pre-determined, the beam 12 deforms following a curve line in real practice. However, if the degree of elastic deformation is small, an approximating line 12I may be assumed and the approximating line 12I forms a angle $\theta$ of elastic deformation between the second elastic component E2. The geometrical relationship in case where the beam elastically deforms by the angle $\theta$ of elastic deformation is shown in FIG. 3b.

As shown in FIG. 3b, the angle $\theta$ is in the smaller range e.g. 0.1 to 10 degree, the beam after elastic deformation 12I may be approximated by the approximating line 12I. The base 13 is included in the inelastic region, thus it forms a tangent plane at the boundary $B_s$ with the beam 12 or at one edge of the deformed beam 12. Further, it forms an intersection point T of a hypothetical horizon $H_1$. Here, the angle between hypothetical horizon $H_1$ and the tangent plane is $2\theta$. If the elastically deformed connecting element is acceptable to the geometric relationship shown in FIG. 3b, the contact tip 14 moves horizontally and vertically in a certain distance and its distance is shown in FIG. 3c.

FIG. 3c shows the distance of the contact tip 14 when it moves vertically and horizontally after elastic deformation.

Referring to FIG. 3c, the contact tip moves from the initial position I where it contacts with the electrode pad for the first time to the final position F due to the elastic deformation. It is assumed that the base 13 vertically extends downward at the boundary with the beam 12, and the vertically extended distance D is a distance from the top to the bottom of the base 12 in order that the invention may be more clearly understood.

If is assumed that the basis point of elastic deformation B is the boundary of the fixing post 11 and the beam 12, the height change $D_M$ of the top of the base 13, the horizontal movement distance $D_H$ and the vertical movement distance $D_v$ of the contact tip 14 may be approximately expressed by the following formulas. In the following formulas, it is calculated approximately, but expressed as an equation for easy understating of the present invention. If necessary, it may be expressed in other way.

The height change ($D_M$) of the top of the base (13)=$L\sin\theta$

The horizontal movement distance ($D_H$) of the contact tip (14):

$$D\sin\theta + L(\cos\theta - 1)$$

The vertical movement distance ($D_v$) of the contact tip (14):

$$D(1-\cos\theta) + L\sin\theta$$

D means a vertically extended length of the base 13 including the contact tip 14 and L means the length of the beam 12.

In the above formulas, it is assumed that the contact tip 14 is disposed on the straight line which vertically extends from the boundary of the beam 12 and the base 13 and it may be calculated by the geometric relationship, but not described in detail for easy understanding of the present invention.

The horizontal movement distance $D_H$ of the contact tip 14 relates to the length of a scrub, and the vertical movement distance $D_v$ relates to the height of the contact tip 14 which relatively changes by the elastic deformation of the beam 12. For example, if the horizontal movement distance $D_H$ is small, a scrub is made in a smaller length, and if the vertical movement distance $D_v$ is small, the angle of elastic deformation should be larger enough to make two connecting elements different in each height in the vertical direction make contact with the electrode pad at the same time. When a plurality of connecting elements are arranged on the surface of one connecting element, the length of a scrub may be different and errors in height of a connecting element may occur due to production errors and the inhomogeneous flatness of an electronic element itself. As a result, the angle of elastic deformation between each connecting element may be different. As each connecting element makes a larger scrub, the difference in length between the scrubs may be bigger. Therefore, it is advantageous to make a smaller size of a scrub. Meanwhile, when a plurality of connecting elements is arranged on the same electronic component, an error in height may occur between connecting elements. In order to compensate the height errors, it is advantageous that the contact tip 14 has a greater vertical movement distance.

The horizontal movement distance $D_H$ of the contact tip 14 is shorter as the vertically extended distance D of the contact tip 14 is shorter, and as the length L of the extended region of the beam 12 is longer. Therefore, it is advantageous to make the vertically extended distance D of the contact tip 14 shorter and the length L of the extended region of the beam 12 of the elastic region longer in order to minimize the length of scrub on the electrode pad. Meanwhile, the vertical movement distance $D_v$ of the contact tip 14 is greater as the vertically extended distance D of the contact tip 14 and the length of extended region of the beam 12 are greater. Therefore, it is advantageous that both the vertically extended distance D of the contact tip 14 and the length L of extended region of the beam 12 are greater in order that the contact tip vertically moves in a longer distance.

In this description, the differences in length of a scrub and in height between connecting elements include all of errors caused by errors in the design and production processes and errors in the degree of flatness of the first and second electronic elements by heat deformation.

The horizontal movement distance $D_H$ or the length of a scrub of the contact tip 14 is calculated based on the both ends of the elastic region. The base 13 is included in the inelastic region and the contact tip 14 is formed under the bottom of the base 13. The contact tip 14 is coupled to the bottom plane of the base 13 and then protruded downward. A scrub made on the electrode pad P is determined by the contact tip 14, thus the above-mentioned vertical movement should be complemented.

FIG. 4a shows the contact tip 14 when it changes its position by the relationship of the contact tip 14 coupled with the base 13.

The base 13 is included in the inelastic region, thus the top 131 of the base 13 does not elastically deform. The top 131 of the base 13 extends along a tangent line from a final point $E_{BF}$ of the beam 12. In real practice, a tangent plane is formed between a volume of the beam 12 and the top 131 plane of the base 13. For easier understanding of the present invention, however, the initial point $E_{BI}$ and the final point $E_{BF}$ of the beam are expressed as a point and the top 13 and the bottom 132 of the base 13 are expressed as a plane. If necessary, it may be expressed clearly as a plane.

As already mentioned above, the horizontal movement distance and the vertical movement distance of the contact tip 14 are expressed with the following formulas.

The horizontal movement distance $D_H$ of the contact tip 14:

$$D\sin\theta + L(\cos\theta - 1)$$

The vertical movement distance $D_v$ of the contact tip 14:

$$D(1-\cos\theta) + L\sin\theta$$

L means an extended distance of the elastic region and D means a vertically extended distance of the contact tip, thus L means a distance between the initial point $E_{BI}$ and the final point $E_{BF}$. The contact tip 14, however, may be disposed anywhere on the bottom surface 132 of the base. Therefore, the horizontal movement distance $D_{TH}$ should be complemented according to a position where the contact tip is coupled to the bottom surface 132 of the base. The given formulas may be applied assuming that the contact tip is positioned at the initial point $S_{L1}$. If the contact tip 14A is disposed at a first middle point $S_{L2}$ with spacing $D_{B1}$ from the initial point $S_{L1}$ of the base, the size should be complemented as shown in FIG. 4b.

FIG. 4b shows the contact tip 14A when it changes its position.

It is assumed that the connecting element elastically deforms up to the boundary of the beam 12 and the base 13 and the base 13 is included in the inelastic region. A angle $\theta$ of elastic deformation is formed from a straight line connecting the initial point $E_{B1}$ and the final point $E_{BF}$ of the extended or elastic region of the beam 12 after elastic deformation to an extended line of the beam 12 prior to elastic deformation. Referring to FIG. 3b, if the angle θ of elastic deformation is small enough e.g. 0.5 to 10 degree, a tangent line on the final point $E_{BF}$ of the elastic region or the boundary point between the beam 12 and the base 13 meets the initial extended line of the beam and forms a degree of 2θ. The base 13 is included in the inelastic region, thus the tangent line is parallel to the extended line of the bottom surface of the base 132. The extended line of the base 13 and the initial position of the beam 12 meet at a intersection point T, from which the final point $E_{BF}$ of the beam 12 is located at a distance of (½)L. It is assumed that the vertically extended distance D means a distance from the top 131 of the base 13 to the edge of the contact tip 14, 14A, and the contact tip 14A moves on the bottom surface of the base 132 at a certain distance such that its center is located at a shifted distance $D_{B1}$. The base 13 rotates by the degree of 2θ with the distance of (½)L between the intersection point T and the final point $E_{BF}$. After each coordinate is obtained, the horizontal movement distance $D_{TH}$ and the vertical movement distance $D_{TV}$ of the contact tip 14A are complemented and approximately expressed by the following formulas.

The horizontal movement distance $D_{TH}$ of the complemented contact tip 14A:

$D(\sin θ)+L(\cos θ-1)+D_{B1}\cos 2θ-D_{B1}=D\sin θ+L(\cos θ-1)+D_{B1}(\cos 2θ-1)$=the movement by the beam 12+the movement by the shifted distance $D_{B1}$ The vertical movement distance $D_{TV}$ of the complemented contact tip 14A:

$D(1-\cos θ)+L\sin θ+D_{B1}\sin 2θ$=the movement by the beam 12+the movement by the shifted distance $D_{B1}$ $D_{B1}$ (cos 2 θ-1) as a complemented value is a minus value, thus as the contact tip 14 is disposed in a direction from the bottom surface 132 of the base to further from the fixing post 11, the size of the scrub is smaller. As a result, as the contact tip 14 is disposed on the bottom surface of the base 132 further from the initial point $S_{L1}$, it makes a smaller scrub. At the same time, the vertical movement distance $D_{TV}$ is greater.

As mentioned above, it is advantageous in terms of making a scrub that the contact tip 14 is disposed at a shifted distance $D_{B1}$ on the bottom surface 132 of the base. Meanwhile, it is useful to make a stable structure and increase the vertical movement distance by having a shifted distance $D_{B1}$. The shifted distance $D_{B1}$ of the bottom surface 132 of the base is determined relating to the height of the contact tip 14A.

FIG. 4c shows the relationship of the extended distance of the base and the height of the contact tip 14A.

It is assumed that the beam 12 elastically deforms at its maximum. The center of the contact tip 14 is assumed being disposed from the initial point $S_{L1}$ of the bottom surface 132 of the base at a shifted distance $D_{B1}$, and the contact tip 14A has a tip height $T_H$. Here, each end of the initial point $S_{L1}$ and the contact tip 14A at a maximum degree of elastic deformation should not be located on the same line. If they are positioned on the same line, disadvantageously, an additional pressure is exerted to the surface of the electronic component or the connecting element, thus at least one of two elements may be damaged. Therefore, the tip height $T_H$ should be determined by the following condition.

$T_H > D_{B1} \tan 2θ_{MAX}$

In terms of contact stability, it is preferred as the tip height $T_H$ is higher and the contact tip 14A is closer to the initial point $S_{L1}$ of the base.

However, the tip height $T_H$ may be adjusted and it is advantageous to make a shorter scrub, thus the center of the contact tip 14A is located at least at the center of the bottom surface 132 of the base and, advantageously, out of the center of the bottom surface 132 of the base and further from the fixing post 11. The vertically extended distance D of the base 13 increases the horizontal movement distance of the contact tip 14 (Dsin θ) and the shifted distance $D_{B1}$ of the contact tip 14A decreases the horizontal movement distance of the contact tip 14A ($D_{B1}$(cos 2θ-1)). The difference of changes in the horizontal movement distance according to the changes in the vertical height is compared, and if the changes in both the vertical height and the horizontal movement distance are expressed as ΔD, the changed value is expressed as f(Δ) =ΔDsin θ+ΔD(cos 2θ-1). Here, f(θ) is a minus value (at least in the range of 0°<θ<20°), the size of the scrub is more effectively reduced by horizontally moving (the contact tip) along the bottom surface 132 at a shifted distance $D_{B1}$ rather than decreasing the vertical height. Therefore, it is advantageous to decrease the scrub size by forming an appropriate size of the base 13 and forming the contact tip 14A on the bottom surface 132 of the base further from the fixing post.

As mentioned above, in the process of elastic deformation of the beam of the connecting element, the contact tip should remain contacted with the electrode pad while removing the oxidation layer on it. When a plurality of connecting elements simultaneously contact with a plurality of electrode pads, it is preferred that the horizontal movement distance of each contact tip is small.

FIG. 5a shows an embodiment of the scrub on the electrode pad made by the contact tip. The electrode pad P is rectangular-shaped with a length $P_L$ and a width $P_w$ and an oxidation layer on its surface. A scrub S consists of a scrub length $S_L$ and a scrub width $S_w$, and it is made inside of the electrode pad P at 10 to 60% of the size of electrode pad. If the contact tip is pyramid-shaped, the scrub width Sw is narrow and if it is prismoid-shaped, the scrub width Sw is broad. In order to make a scrub shown as in FIG. 5a, the contact tip comes into contact with the electrode pad P at an initial position $C_I$ and if the beam elastically deforms at its maximum, the contact tip should be disposed at the final position $C_F$ When a plurality of connecting elements simultaneously contact with a plurality of electrode pads, there is a difference in height between each connecting element. If each connecting element having different height contacts with the electrode pad and makes a scrub, each of initial scrub position and scrub depth are to be different.

FIG. 5b shows various forms of scrubs made by connecting elements having a different height.

FIG. 5b (left) illustrates a scrub made from a pre-determined initial contact position $C_{I0}$ to a pre-determined final contact position $C_{F0}$. In comparison to this, FIG. 5b (middle and right) show embodiments of scrubs made higher or lower than pre-determined due to errors in height of each connecting element. In the process of arranging connecting elements, each connecting element is arranged at the same region corresponding to each electrode pad P. During the producing and testing processes, errors may occur in the horizontal (x-y) and vertical (z) directions, and usually errors in the vertical direction related to the flatness of the first electrode component or the second electrode component occur as a main problem. Typically, errors related to flatness may occur in the producing process, but also in the testing process due to the deformation of electronic components or connecting elements by heat. When electronic components happen to deform by the heat during the testing process, it affects errors in both horizontal and vertical direction. Errors in vertical direction relate to the deflection of the electronic component plane and in real practice, and a large error in the vertical direction may cause damages on electrode pads or the connecting elements during the test. When the errors in the vertical direction (which means deviation values between connecting elements in the z-direction) occur, each initial contact position $C_I$ is same regardless of the difference in height of each connecting element, but final contact positions ($C_{F0}$, $C_{F1}$, $C_{F2}$) are different from each other. If the connecting element is located higher than the pre-determined position, the final contact position $C_{F1}$ moves forward and makes a smaller scrub than pre-determined, or if there is a large difference in height, the connecting element may not remove the oxidation layer $O_S$ and it may not reach the electrode pad P. Meanwhile, if the connecting element is disposed lower than the pre-determined position, the final contact position $C_{F2}$ moves backward and makes a longer scrub than pre-determined or if the contact position is too low, it may cause a extreme contact pressure and break up the oxidation layer $O_S$ and, worse yet, damage the bottom of the contact pad P. Accordingly, the initial contact position $C_{I0}$ of each connecting element is same regardless of the difference in height, but the final contact position CFO is different from each other. If it is disposed higher than the pre-determined position, it may be enough to remove the oxidation layer $O_S$, and on the contrary, if it is disposed lower than pre-determined, it may remove the oxidation layer $O_S$, but may damage the bottom of the electrode pad P or the contact tip may move out of the electrode pad P. If there is a large error in height, while a connecting element elastically deforms at its maximum, its contact tip may not reach to the initial contact position $C_{I1}$ of the electrode pad P. In order to solve this problem, FIG. 5c shows a solution.

FIG. 5c shows embodiments of contact tip in order to reduce errors in height between connecting elements.

Referring to FIG. 5c (left), the beam 12 extends toward the electrode pad P, forming an angle between the fixing post larger than 90 degrees. The base 13 is formed parallel to the electronic component plane or extending at an inclination of the beam 12. Meanwhile, FIG. 5c (right) shows that the beam 12 extends toward the electrode pad P and has an arched form due to the weight of base 13. As a result, the angle of elastic deformation is increased as shown in FIG. 5c (left), and it remains same except changing the initial contact position as shown in FIG. 5c (right). In each embodiment, it is required to determine an angle of inclination $\theta_C$ in order to make a scrub as pre-determined or reach the initial contact position of the electrode pad P. If it is assumed that the whole size of the scrub is 10 to 60% of that of the electrode pad, and the unscrubed region in the electrode pad is 40 to 90% of the length of scrub. Those given ranges may be applicable only when the contact tip 14 makes a scrub by the elastic deformation. The size of scrub may be increased by heat or other pressure during the test. For example, even if the scrub size is 10% of the entire electrode pad P by elastic deformation, in real practice, it may be 30 to 60% or more due to the heat deformation.

If a scrub is made at the center of the electrode pad P and the scrub size is 10 to 60% of the electrode pad P, it is preferred that the initial contact position moves by the inclination of the beam 12 at a distance of 10 to 22.5% of the scrub size. Here, the angle of inclination $\theta_C$ may be 10 to 22.5% of the maximum angle of elastic deformation. The maximum angle of elastic deformation is pre-determined in the process of designing connecting elements.

If the beam 12 forms an inclination angle due to the weight of the base 13, bending strength or modulus of elasticity according to the length of the beam 12 are pre-determined and accordingly the weight of the base 13 may be determined.

FIG. 5d shows other embodiment of the beam 12 extending with an inclination angle.

Referring to FIG. 5d, the beam 12 includes a horizontally extended region $B_H$ where it extends in parallel to the electronic component plane and an inclined extended region $B_T$ where it extends with an inclination angle. The base 13 is formed parallel to the horizontally extended region $B_H$ or the inclined extended region $B_T$. As already mentioned above, the vertical movement distance of the contact tip may be expressed by the formula: $D\sin\theta + L(\cos\theta - 1)$. According to the embodiment of FIG. 5d, the value of L is decreased, thus the inclination angle should be decreased compared to the example of FIG. 5c (left). If the size of the horizontally extended region $B_H$ is small enough, however, the error may be negligible and the same inclination angle $\theta_C$ is formed.

FIG. 5d (right) shows an embodiment of the beam having a curved-form due to the weight of the base 13 and its plain figure (below). As shown in the plain figure, the beam 12 consists of a fixing region $F_A$ coupled to the fixing post 11, an elastic region $E_A$ extending from the base 13 and a connecting region $C_A$ connecting the fixing region $F_A$ and the base 13. The elastic deformation of the fixing region $F_A$ is negligible and the elastic region $E_A$ and the connecting region $C_A$ may be subject to elastic deformation, and particularly the elastic region $E_A$ is narrow in width, thus it easily elastically deform compared to the connecting region $C_A$. The horizontal and vertical movement distances of the elastic region $E_A$ may be calculated by the same way of the elastic deformation of the beam 12. But it is inversely moving in the horizontal direction. If the height from the top of the base 13 to the contact tip is a tip height $T_H$, the horizontal movement distance and the vertical movement distance are approximately expressed as follows.

The horizontal movement distance of the contact tip:

$$T_H \sin\theta_C + L_{CE}(\cos\theta_C - 1)$$

The vertical movement distance of the contact tip:

$$T_H(1 - \cos\theta_C) + L_{CE}\sin\theta_C$$

It is preferred that the contact tip horizontally moves in a shorter distance and it vertically moves in a greater distance. Thus, it is preferred to have a longer elastic deformation length $L_{CE}$. The difference between the horizontal and vertical movement distances may be expressed as follows: $T_H(\sin\theta_C - 1 + \cos\theta_C) + L_{CE}(\cos\theta_C - 1 - \sin\theta_C) = (T_H - L_{CE})\sin\theta_C + (L_{CE} + T_H)(\cos\theta_C - 1) < 0$. Thus, the vertical movement distance is greater than the horizontal movement distance. With an inclination angle $\theta_C$, if the initial contact position moves at a distance of $\Delta L$, the height is complemented as $\Delta T > \Delta L$. With the inclination angle $\theta_C$, the relative position of the contact tip to the base 13 may be complemented.

As the tip height $T_H$ is higher, both the horizontal and vertical movement distances are increased. The horizontal movement distance, however, is decreased by the length of the extended region $L_{CE}$. Thus, in terms of errors in height, it is preferred to have a greater tip height $T_H$. The inclination angle $\theta_C$ may be determined by the size of a scrub, the pre-determined initial contact position and the pre-determined angle of elastic deformation. If the pre-determined initial contact position is determined at the center of the electrode pad, in real practice the inclination angle $\theta_C$ may be the same as the permitted angle of elastic deformation.

The connecting element in FIG. 5d (right) may be designed as follows. At first, the length of a scrub to be made on the electrode pad is determined. Then, the relative size of the scrub to the electrode pad is determined and ½ length of the unscrubbed region of the electrode pad is determined. Then, the inclination angle $\theta_C$ is determined in order to dispose the contact tip 14 as pre-determined. Thereafter, the length and width of the elastic region $E_A$ is determined. Accordingly, the length of the connecting region $C_A$ is determined. The length and the width of the elastic region $E_A$ and the connecting region $C_A$ are determined to be applicable with the inclination angle $\theta_C$. Lastly, after the fixing region $F_A$ is determined, the connecting element having an inclined beam 12 is designed. This process may be used as an example and a connecting element having an inclined beam may be designed in other way. The initial contact position of the contact tip 14 to the electrode pad according to the inclination angle may be determined in the same way as described in embodiment of FIG. 5d (left).

FIG. 6a shows various forms of contact tip structure.

As shown in FIG. 6a (left to right), the contact tip 14 may have a trapezoid-shaped section with the same size of the width of the base 13, a square-shaped protrusion section attached to a trapezoid and a trapezoid-shaped section with narrower size than the width of the base 13. The contact tip 14 (left) has a disadvantage that the size of a scrub may become larger on it. Meanwhile, the contact tip 14 (middle) is advantageous having a regular width of a scrub, but it has a disadvantage having an unstable center of gravity, thus the depth of a scrub may be different from each other depending on its width. In comparison to the said contact tips, the contact tip 14 (right) has an advantage in dispersing force or pressure according to the width direction and has another advantage that the difference in width of the scrub according to the length is small. The contact tip according to the present invention may have any forms, preferably the form in the FIG. 6a (right). In case of a pyramid-shaped contact tip, the edge of the tip is not in the form of a point, but in real practice, a plane. Thus, in real practice, the contact tip is pyramid-shaped.

FIG. 6b shows a process of making a scrub by moving the contact tip 14 horizontally on the electrode pad P.

FIG. 6b (left) shows that initially the contact tip 14 contact with the electrode pad P on its plane (plane contact). But, if the beam 12 is inclined, the contact tip 14 contacts with the electrode pad P on its line (line contact). As the second electronic component moves upward, the connecting element elastically deforms and accordingly the contact tip 14 moves on the electrode pad P horizontally along a pre-determined direction. As shown in FIG. 6b (left), when the contact tip 14 initially contacts with the electrode pad P, both the front contact line $T_F$ and the real contact line $T_R$ of the contact tip 14 come into contact with the electrode pad P and only the real contact line $T_R$ remains contacted with the electrode pad P until the beam finishes the process of elastic deformation. In case of an inclined beam, however, once the process of elastic deformation begins, the contact tip contacts with the electrode pad in the following order; the front contact line $T_F$, plane contact and the real contact line $T_R$. As a result, the shape of scrub made on the electrode pad P is shown below the FIG. 6b. The shape of scrub S made on the electrode pad P is determined by the real contact line $T_R$ of the contact tip 14. Therefore, the length of the scrub S on the electrode pad P should be determined by the real contact line $T_R$ of the contact tip 14. The movement distance of the contact tip 14 is expressed as follows.

Parallel beam: $D \sin \theta + L(\cos \theta - 1) + D_B \cos 2\theta - D_B = D \sin \theta_C + L(\cos \theta - 1) + D_B(\cos 2\theta - 1)$ Inclined beam: $D \sin \theta + L(\cos \theta - 1) + D_B(\cos 2\theta - 1) + D \sin \theta_C + L(\cos \theta_c - 1) + D_B(\cos 2\theta_c - 1)$ In order to transfer electric signals to the electrode pad P, the oxidation layer should be removed first. In order to remove the oxidation layer, however, a certain pressure is required and electric signals are not transferred while the contact tip 14 moves at a certain distance from the initial contact position. The oxidation layer is removed by elastic deformation of the beam 12, thus in the formula of the horizontal distance of the contact tip 14, when angle $\theta$ value remains below a certain value, in real practice the beam doesn't contact with the electrode pad P. As the angle of elastic deformation is increased, the pressure exerted to the electrode pad P by the contact tip 14 is increased. In the given formula, typically, L is larger than D and the differentiated value is expressed as $D \cos \theta - L \sin \theta$, thus a higher value of angle $\theta$ means that the contact tip 14 moves at a shorter distance. Therefore, the contact tip moves at a greater distance since its initial contact with the electrode pad, and it moves at a shorter distance since the elastic deformation. In real practice, the entire movement is smaller compared to the size of the electrode pad P, thus the final position of the contact tip 14 is usually within the electrode pad P. In real practice, when D is sufficiently smaller than L, a higher value of angle $\theta$ means rather that the horizontal movement distance may be reduced.

If contact tip 14 moves in the horizontal direction at a smaller distance compared to the electrode pad, it is preferred that the contact tip 14 is moved forward from the center of the electrode pad P and arranged considering the center of the pad or the scrub size. However, while the contact tip 14 initially contacts with the electrode pad P and moves at a certain distance, a sufficient pressure enough to remove the oxidation layer may not be exerted to the electrode pad P. Thus, it is preferred to dispose the contact tip 14 backward from the center of the electrode pad P. A basis line for arranging the contact tip 14 may be different depending on the shape of the contact tip. For example, in case of a pyramid-shaped contact tip, its peak point becomes a basis line for arranging contact tips. Meanwhile, in case of a prismoid-shaped contact tip, a vertical line of back of its square-shaped contact plane may make a scrub in real practice. Thus, the rear vertical line of the contact line may be the basis line for arranging the contact tips. In case of the inclined beam, the basis line for arranging the contact tips may be the center of the prismoid. Accordingly, the position for arranging the contact tips should be determined based on the position where scrubs are made in real practice. The degree how the basis line for arranging contact tips moves out of the center of the electrode pad is determined considering the whole size of scrub or a permitted angle of elastic deformation. For example, if the permitted angle of elastic deformation at its maximum is pre-determined as $\theta_{MAX}$, the errors in the basis line for arranging tips may be complemented in the range of 1/20 to 2/3 of the maximum permitted angle of elastic deformation. The degree how the basis line for arranging contact tips moves out of the center of the electrode pad is calculated within the said range by the following formula: $D \sin \theta + L(\cos \theta - 1) + D_B(\cos 2\theta - 1)$ (in case of a horizontal beam). In case of an arch-formed inclination beam, however, the inclination angle may be varied, but in real practice, the inclination angle is determined in the same way as mentioned above. Thus, in the designing process, an uninclined beam may be assumed in order to dispose the contact tip at the center of the electrode pad or at a pre-determined contact point where a scrub is initially made.

As already mentioned above, the length of a scrub may be greater by an external factor such as heat deformation during the testing process. In real practice, a scrub S may be made greater by the heat deformation than by the elastic deformation of the beam 12. A scrub is made by heat deformation when the beam 12 usually elastically deforms at its maximum, and the beam remains elastically deformed at its maximum for a certain time in order to transfer electric signals during the time. Considering a pre-determined size of a scrub S, the basis line for arranging the contact tip 14 may be positioned backward at a certain rate of the whole size of scrub S. If the size of a scrub by heat deformation is greater than that by elastic deformation of the beam 12, when the beam elastically deforms at its maximum, the connecting element may be designed in order that the basis line for arranging contact tip is positioned at the center of the electrode pad P. Alternatively, it may be designed that the basis line is positioned backward from the center of the electrode pad P at a distance of 1/20 to 1/5 of the whole size of the electrode pad P. As already mentioned above, the length of scrub is determined by the horizontally extended length L the vertically extended length D of the beam 12. Further, the vertically extended length D of the beam 12 increases the length of scrub S, while the horizontally extended length L decreases the length of scrub S. Thus, if the horizontally extended length L is greater than the vertically extended length D, when the beam 12 elastically deforms by a certain angle, or at its maximum, the connecting element may be designed that the basis line for arranging contact tips 14 is positioned at the center or slightly backward from the center of the electrode pad P. In case of a connecting element having an inclined beam 12 by which only the initial contact position is changed, it may be designed that the final contact point is disposed at the center of the electrode pad P. Even though the described above is an embodiment of heat deformation of the first electronic component or the second electronic component, if the size of scrub by the elastic deformation is e.g. less than 20% of the whole size of the electrode pad, the final position of the contact tip 14 may be designed to be disposed at the center of the electrode pad, regardless of the heat deformation.

By the elastic deformation of the beam 12, the contact tip 14 exerts a pressure in a certain amount to the electrode pad P. The pressure may be varied depending on the shape of contact plane of the contact tip 14.

FIG. 6c shows various form of contact tip structure.

Referring to the FIG. 6c, the shape of the contact plane of the contact tip may be a square, a rectangle having a longer horizontal line and a rectangle having a longer vertical line. Here, the square-shaped contact plane is approximately formed. In real practice, a pyramid-shaped contact tip has a square-shaped contact plane. In case of the contact tip of the rectangle having a longer horizontal line, the initial contact line or the final contact line $T_R$ is shorter than the non-contact line $T_L$. Meanwhile, in case of the rectangle having a longer vertical line, the initial contact line or the final contact line $T_R$ is longer than the non-contact line $T_L$. The rectangle having a longer horizontal line makes a narrow scrub, while the rectangle having a longer vertical line makes a broad scrub. The rectangle having a longer horizontal line focuses on pressure, while the rectangle having a longer vertical line disperses pressure. As a result, the two rectangles make a scrub having a different depth. Depending on the modulus of elasticity of the beam, bending strength or the length of the beam, the shape of contact tip is selected among the two rectangles. With greater length of the beam, the pressure exerted at the edge of the beam is reduced, thus in this case the rectangle having a longer horizontal line is preferred. Meanwhile, with shorter length of the beam, the pressure exerted at the edge of the beam is increased, thus in this case the rectangle having a longer vertical line is preferred. All forms of contact tips may have asymmetric structure, and the basis line for arranging the contact tip on the electrode pad may be real contact line $T_R$.

FIG. 7 shows an embodiment of the contact tip and an embodiment of its relative position to the electrode pad according to the present invention.

The FIG. 7 shows a front view, a plane figure and a side view. The beam 2 includes the fixing region $F_A$, the elastic region $E_A$ and inelastic region $T_A$, and the fixing region $F_A$ and the inelastic region $T_A$ may extend having a different width, and accordingly the width of the elastic region $E_A$ may be varied according to the direction. The fixing region $F_A$ may be coupled to a fixing post (not shown). In order to reduce the length of scrub, the length of the elastic region $E_A$ may be greater than the inelastic region $T_A$. In order to complement the height difference between connecting elements, the base 13 extends downward at a certain distance, but the vertically extended length $B_V$ of the base 13 may be limited considering the length of scrub determined by the length of the elastic region $E_A$ or inelastic region $T_A$. At least a part of the inelastic region $T_A$ is coupled to the base 13 or manufactured monolithically or separately and then coupled thereafter. The contact tip 14 may be pyramid-shaped, preferably, prismoid-shaped, and has an asymmetric structure being protruded downward and coupled to the bottom of the base 13. The connecting element may have an asymmetric structure in terms of shape and it may be asymmetric in terms of position in which the center of the contact tip 14 moves in the extended direction based on the center line $B_{CL}$ of the base 13. In this case, the lower part of the base 13 comprises the rear edge $R_E$ and the front edge $F_E$. When the connecting element is asymmetric in terms of position, $R_E$ becomes greater than $F_E$, but the contact tip 14 in the present invention is not limited to the asymmetric structure. The contact tip 14, as shown below in FIG. 7, is coupled to the base 13 having a narrower width than the width $B_W$ of the base 13. As a result, the contact pressure to the electrode pad P may be increased and the width of scrub may be narrower. Further, as already mentioned above, the height of the contact tip 14 may be limited by the position where the base 13 and the contact tip 14 is coupled.

The contact tip 14 makes contact with the electrode pad P formed on the surface of the second electronic component E2 and makes a scrub. The initial position of the contact tip 14 for making a scrub is determined backward from the center $P_C$ of the electrode pad or out of the opposite direction of making a scrub. The shift of the initial contact position $C_D$ may be limited by the length of the scrub or the vertical movement distance of the contact tip 14. The basis line for arranging the contact tip 14 may be the rear contact line $T_R$ of the contact tip 14. As already mentioned above, if the beam 12 elastically deforms at a certain degree or at its maximum, the connecting element may be designed in order that the basis line for arranging the contact tip 14 is positioned at the center of the electrode pad. Likewise, the basis line for arraigning contact tip 14 may move backward regardless of the heat deformation, and if the pre-determine length of the scrub is small, it is applicable to all of connecting elements in which the horizontally extended length of the beam 12 is greater than the vertically extended length of the contact tip 14.

The present invention is described in detail using embodiments, but it is opened to a person skilled in this field who may make a variety of variations and modifications available within the technical scope of the concept of the present inven-

EFFECTS OF INVENTION

The contact tip of the connecting element according to the present invention makes a scrub having a required size on the electrode pad. Further, the present invention advantageously reduces the height error which may occur between each different connecting element.

The invention claimed is:

1. A contact tip structure of a connecting element comprising a fixing post coupled to a first electronic component; a beam extending away from said fixing post; a base coupled at one end of the said beam; and a contact tip extending vertically from the bottom surface of the said base, characterized in that;

the beam includes an elastic region and an inelastic region extending at a shorter distance than the elastic region; the base vertically extends from the inelastic region in a certain distance; the contact tip is coupled to the bottom surface of the base to have a free end thereon; and the horizontally extended length (L) of the elastic region of the beam and the vertically extended length (D) of the base are determined in order that a horizontally movement distance of the contact tip has predetermined values, wherein the height of the contact tip is limited by the length of the free end; and the horizontal movement distance of the contact tip is determined according to the following formula:

$D\sin\theta + L(\cos\theta - 1)$ where $\theta$ means an angle of elastic deformation in the elastic region.

2. The contact tip structure of the connecting element according to claim 1, wherein the horizontally extended length (L) of the elastic region of the beam is greater than the vertically extended length (D) of the base.

3. The contact tip structure of the connecting element according to claim 1, wherein the contact tip is asymmetrically coupled to the base.

4. A contact tip structure of a connecting element comprising a fixing post coupled to a first electronic component; a beam extending away from said fixing post; a base coupled at one end of the said beam; and a contact tip extending vertically from the bottom surface of the said base, characterized in that;

the beam includes an elastic region and an inelastic region extending at a shorter distance than the elastic region; the base vertically extends from the inelastic region in a certain distance; the contact tip is coupled to the bottom surface of the base to have a free end thereon; and the horizontally extended length (L) of the elastic region of the beam and the vertically extended length (D) of the base are made in order that a vertically movement distance of the contact tip has predetermined values, wherein the height of the contact tip is limited by the length of the free end; and the vertical movement distance of the contact tip is determined according to the following formula:

$D(1-\cos\theta) + L\sin\theta$ where $\theta$ means an angle of elastic deformation in the elastic region.

5. A contact tip structure of a connecting element comprising an electrode pad extending from a certain position of the first electronic component to the second electronic component for transferring the electric signal, and a contact tip formed on the surface of the base formed at one end of the beam, characterized in that the beam includes an elastic region and an inelastic region extending at a shorter distance than the elastic region; the base vertically extends from the inelastic region in a certain distance (1); the contact tip is coupled to the bottom surface of the base to have a free end thereon and vertically extends from the bottom of the base at a certain distance (2), wherein the length of the elastic region and the distance (1) are determined in order that the horizontal and vertical movement distance of the contact tip according to the elastic deformation of the elastic region has a pre-determined values; the distance (2) is determined by the relative position of the center of the coupling plane on which the contact tip is coupled to the bottom surface of the base and the maximum angle of elastic deformation of the beam; and the horizontal and vertical movement distance is expressed by the following formula:

the horizontally movement distance: $D\sin\theta + L(\cos\theta - 1)$, and the vertically movement distance: $D(1-\cos\theta) + L\sin\theta$, where L means the horizontally extended length of the elastic region and D means the distance (1) and $\theta$ means an angle of elastic deformation in the elastic region.

6. The contact tip structure of the connecting element according to claim 5, wherein L is greater than D.

7. The contact tip structure of the connecting element according to claim 5, wherein the contact tip is asymmetrically coupled to the base.

8. The contact tip structure of the connecting element according to claim 5, wherein the distance (2) is approximately greater than $D_B \tan 2\theta_{MAX}$, wherein $D_B$ means a distance from the bottom edge of the base to the center of the coupling plane and $\theta_{MAX}$ is the maximum angle of elastic deformation.

9. A contact tip structure of a connecting element comprising a fixing post coupled to a first electronic component; a beam extending away from said fixing post; a base coupled at one end of the said beam; and a contact tip extending vertically from the bottom surface of the said base, characterized in that;

the beam includes an elastic region and an inelastic region extending at a shorter distance than the elastic region; the base vertically extends from the inelastic region in a certain distance; the contact tip moves in the horizontal direction at a certain distance by the pressure applied in the vertical direction; and the elastic region moves downward inclinationally to the surface of the first electronic component by the pressure applied in the vertical direction, wherein the degree of inclination is determined in order that at least a part of the entire horizontal movement distance of the contact tip is determined by the degree of inclination of the elastic region; and the entire horizontal movement distance of the contact tip is determined by approximately calculating the horizontal movement distance of the contact tip depending on the length (L) of the elastic region of the entire beam and the length (D) of the base according to the following formula:

$D\sin\theta + L(\cos\theta - 1)$ where $\theta$ means an angle of elastic deformation of the beam on the basis of a plane in parallel with the first electronic component.

10. The contact tip structure of the connecting element according to claim 9, wherein the elastic region extends following a straight line.

11. The contact tip structure of the connecting element according to claim 9, wherein the elastic region extends in an arch form.

12. The contact tip structure of the connecting element according to claim 9, wherein the elastic region of the beam which extends downward is formed in order that the contact tip horizontally moves at a distance of 5 to 30% of the entire horizontal movement distance of the contact tip by the degree of inclination of the elastic region.

13. The contact tip structure of the connecting element according to claim 9, wherein the beam consists of a horizontally extended region and an inclinationally extended region.

14. The contact tip structure of the connecting element according to claim 9, wherein the beam consists of a fixed region, an elastic region and a connection region.

15. The contact tip structure of the connecting element according to claim 14, wherein the connection region extends towards the beam direction with different width.

16. The contact tip structure of the connecting element according to claim 9, wherein the contact tip is asymmetrically coupled to the base.

17. A connecting element comprising a fixing post coupled to a first electronic component; a beam extending away from said fixing post; a base coupled at one end of the said beam; and a contact tip coupled at the bottom surface of the said base, characterized in that;
the beam and the base have an elastic and inelastic structure, respectively; and the contact tip is coupled to the bottom surface of the base to have a free end thereon, wherein the horizontally extended distance (L) of the beam and the vertically extended distance (D) of the base are determined by the following formulas which shows the movement distance of the contact tip; the size of the free end is determined by the following formula which shows the horizontal movement distance of the contact tip; and the base has an asymmetric structure to the contact tip:
the horizontal movement distance of the contact tip: $D\sin\theta + L(\cos\theta - 1)$,
the vertical movement distance of the contact tip,
$D(1-\cos\theta) + L\sin\theta$ where $\theta$ means an angle of elastic deformation in the elastic region,
the horizontal movement distance of the contact tip which determines the size of the free end: $D\sin\theta + L(\cos\theta - 1) + D_B(\cos 2\theta - 1)$ where $D_B$ is a distance from the boundary of the beam and the base to the center point where the contact tip is coupled to the bottom surface of the base.

18. The connecting element according to claim 17, wherein L and D are determined in order to minimize the horizontally movement distance of the contact tip.

19. The connecting element according to claim 17, wherein L and D are determined to maximize the vertically movement distance of the contact tip.

20. The connecting element according to claim 17, wherein $D_B$ is determined in order that the horizontal movement distance of the contact tip is decreased.

21. The connecting element according to claim 17, wherein L is greater than D.

22. The connecting element according to claim 17, wherein the height of contact tip is determined by the size of the free end.

23. The connecting element according to claim 22, wherein the height of contact tip is approximately greater than $D_B \tan 2\theta_{MAX}$, wherein $D_B$ is a distance from the boundary of the beam and the base to the center point where the contact tip is coupled to the bottom surface of the base and $\theta_{MAX}$ is the maximum angle of elastic deformation of beam).

24. A method of disposing the contact tip attached a certain bottom surface of a base that is coupled a first electronic component and a beam extended in direction of an electrode pad formed a second electronic component in order to make a pre-determined form of scrub on the electrode pad characterized in that;
the contact tip initially contacts with the electrode pad a certain distance away from the center of the electrode pad toward the beam, and the certain distance is the same as at least a part of the entire horizontal movement distance that the contact tip under pressure moves on the electrode pad, wherein at least a part of the entire horizontal movement distance is adjusted by the elastic region distance (L) of the beam and the vertically extended distance (D) of the base; and the entire horizontal movement distance of the contact tip is approximately calculated by the following formula:

$D\sin\theta + L(\cos\theta - 1)$ where $\theta$ means an angle of elastic deformation of the beam.

25. The method of disposing the contact tip according to claim 24, wherein the initial contact position of the contact tip with the electrode pad is based on a part where the beam is elastically deformed and simultaneously contacts with the electrode pad.

26. The method of disposing the contact tip according to claim 24, wherein the contact tip is pyramid-shaped or prisomid-shaped.

27. The method of disposing the contact tip according to claim 26, wherein a region contacting with the prismoid-shaped the electrode pad is a rectangle having a longer horizontal line and a rectangle having a longer vertical line.

28. The method of disposing the contact tip according to claim 27, wherein the initial contact point is the edge of the rectangle having a longer horizontal line and the rectangle having a longer vertical line towards the beam direction.

29. The method of disposing the contact tip according to claim 24, wherein the certain length is 1/20 to 2/3 of the horizontal movement distance of the permitted angel of the beam.

30. A method of disposing the contact tip attached a certain bottom surface of a base that is coupled a first electronic component and a beam extended in direction of an electrode pad formed a second electronic component in order to make a pre-determined form of scrub on the electrode pad characterized in that;
the contact tip initially contacts with the electrode pad a certain distance away from the center of the electrode pad toward the direction coupled with the first electronic component, wherein the certain distance is determined in order that if the beam elastically deforms at its maximum size as pre-determined, the contact tip is disposed at the center of the electrode pad.

31. The method of disposing the contact tip according to claim 30, wherein the initial contact point of the contact tip with the electrode pad is based on a part where the beam contacts with the electrode pad after elastic deformation.

32. The method of disposing the contact tip according to claim 30, wherein the contact tip is pyramid-shaped or prisomid-shaped.

33. The method of disposing the contact tip according to claim 32, wherein a region contacting with the prismoid-shaped the electrode pad is a rectangle having a longer horizontal line and a rectangle having a longer vertical line.

34. A method of disposing the contact tip attached a certain bottom surface of a base that is coupled a first electronic component and a beam extended in direction of an electrode pad formed a second electronic component in order to make a pre-determined form of scrub on the electrode pad characterized in that;

the contact tip initially contacts with the electrode pad a certain distance away from the center of the electrode pad toward the beam, and the certain distance is the same as at least a part of the entire horizontal movement distance that the contact tip under pressure moves on the electrode pad, wherein at least a part of the entire horizontal movement distance is adjusted by the elastic region distance of the beam and the vertically extended distance of the base; and at least a part of the entire horizontal movement distance is $\frac{1}{20}$ to $\frac{1}{5}$ of the whole size of the electrode pad from the center.

35. The method of disposing the contact tip according to claim 34, wherein the initial contact point of the contact tip is a region of the beam contacting the electrode pad after elastic deformation.

36. The method of disposing the contact tip according to claim 34, wherein the contact tip has an asymmetric structure.

* * * * *